United States Patent [19]
Zugravu

[11] Patent Number: 4,803,594
[45] Date of Patent: Feb. 7, 1989

[54] WAVE-SHAPED ELECTROSTATIC DISCHARGE

[75] Inventor: George Zugravu, Arlington, Mass.
[73] Assignee: KeyTek Instrument Corp., Wilmington, Mass.
[21] Appl. No.: 160,645
[22] Filed: Feb. 26, 1988
[51] Int. Cl.[4] ............................................. H01T 23/00
[52] U.S. Cl. ................................................... 361/230
[58] Field of Search ................................ 361/230, 235

[56] References Cited

FOREIGN PATENT DOCUMENTS 3435839 4/1986 Fed. Rep. of Germany ...... 361/230

OTHER PUBLICATIONS

Richman, P. and Tasker, A. "ESD Testing: The Interface Between Simulator and Equipment Under Test" Proceedings of the Sixth EMC Symposium, Zurich 1985.

Primary Examiner—L. T. Hix
Assistant Examiner—David Porterfield
Attorney, Agent, or Firm—Schiller, Pandiscio & Kusmer

[57] ABSTRACT

Current injection electrostatic discharge equipment that includes a discharge capacitor connected to the input terminal of a switch or relay which selectively applies a current discharge from the capacitor to a test tip, the wave shape of the current discharge being shaped to match a standardized waveform. Shaping is achieved by providing first and second inductor coils in series between the output terminal of the switch and the test tip, and by providing an electrically conductive plate connected to the junction of the inductors so as to provide a free space capacitance.

11 Claims, 3 Drawing Sheets

A

C

B

D

WAVE-SHAPED ELECTROSTATIC DISCHARGE

This invention relates to electronic test equipment, and more particularly to current injection electrostatic discharge (ESD) simulator equipment in which the current wave shape unidirectional spike test surges or impulses applied to equipment under test (EUT) by a surge generator are shaped to match a standardized waveform. Adequate ESD suppression can be assured in the design of equipment such as computers and microprocessor-based electronics, only by surge testing during design, production and quality assurance phases of manufacture. Without such suppression and thorough verification of its effectiveness, modern, sensitive electronics will often fail in service when subjected to electrostatic discharge resulting from charged humans or mobile objects contacting the equipment and discharging into the latter.

In order to test computers and other electronic equipment for susceptibility to ESD, machines which simulate ESD have been developed, and are available commercially. Such test generators generally provide open-circuit voltage peaks in excess of 15–20 KV and short-circuit current peaks as high as 50–100 amperes. Such discharges are provided generally through switching means such as a relay, as a series of voltage and current pulses with current-wave durations of typically 20 to 100 nanoseconds.

Many ESD simulators inject current into the equipment under test through an arc, just as in a true ESD. However, since the arc is subject to variation from discharge to discharge, there are also ESD simulators which inject the discharge current directly into the EUT through metallic contact, without an arc. Such a direct discharge through metallic contact is more repeatable than a normal arc discharge, and it is therefore expected that susceptibility test results will also be more repeatable.

In order to further the goal of repeatable current waveforms, standards organizations have developed, and are continuing to develop, criteria for the wave shapes of the currents to be injected by the ESD simulator. A typical standard ESD waveform 20 shown in FIG. 1 (in the present International Electrotechnical Commission draft revision of the ESD standard in Section 801-2), consists of an initial spike 22 with a rapid rise time, spike 22 being followed by a slowly decaying current 24.

Such standards organizations also typically provide a very simple symbolic circuit for the ESD generator. Typically this circuit is simply a capacitor and resistor representing the charged object, such as a human body, in series with a switch representing the instantaneous connection to the equipment under test. It is important to note that in such circuit the EUT forms a part of the discharge current loop. The theoretical waveform, shown in FIG. 2, at the output of such a simple circuit is a current which begins the instant the switch closes, and then decays as the capacitor discharges. Although some prior art ESD simulators attempted to duplicate this simple circuit, as may be seen by comparison of FIGS. 1 and 2, such a simple circuit will not in fact provide the desired wave shape of FIG. 1.

A principal object of the present invention is therefore to provide a circuit that will, in connection with the discharge of an ESD generator that includes switching means, shape the current waveform of the discharge to closely match the desired theoretical waveform for ESD simulation.

It has now been realized that actual physical circuits are not as simple as they appear in a schematic because one must consider not only the discrete circuit components, but must determine and take into consideration the effect of additional stray capacitances, inductances, and resistances. At low frequencies the stray parameters do not significantly affect the operation of the components or circuits, but it has now been found that particularly at very high frequences such stray parameters become a very significant factor in the circuit operation. Because the standard current waveforms being considered to simulate ESD include such very high frequency components, it is not possible to duplicate reasonably these waveforms without purposely and consciously controlling the stray reactances and resistances in the discharge current path.

Other objects of the invention will in part be obvious and will in part appear hereinafter. The invention accordingly comprises the apparatus possessing the construction, combination of elements and arrangement of parts which are exemplified in the following detailed disclosure and the scope of the application of which will be indicated in the claims.

For a fuller understanding of the nature and objects of the present invention, reference should be had by way of example to the following detailed description taken in connection with the accompanying drawings wherein.

The principles of the present invention are generally embodied in apparatus that is an improvement over prior art circuitry for applying ESD simulated pulses from a test tip to equipment under test. Such prior art circuitry typically includes discharge capacitor means to hold the necessary electrical charge. The capacitor is series connected through a first RL circuit to an input terminal of switching means such as a relay for selectively applying a series of discharges from the capacitor to the test tip. The input terminal of the switching means is also series connected through a second RL circuit to one plate of a first free space capacitance.

The improvement provided by the present invention comprises first and second inductances that are series connected between the output terminal of the switching means and the test tip. The improvement also includes another electrically conductive plate connected to the junction of the first and second inductances so as to form part of yet a another free space capacitance. A further aspect is the provision of a capacitive shunt formed in part of a third plate so disposed that when the improvement is attached to or incorporated into such prior art circuitry, the third plate is in physical proximity to the one plate of the first free space capacitance and is therefore coupled to and forms part of the latter. A third RL circuit is series connected between the capacitive shunt and the junction of the first and second inductances. The term "plate" as used herein is intended to indicate an element having the function of a conductive electrode of a capacitor and should not be construed to be limited to any particular geometry or conductive material.

Figure 3:
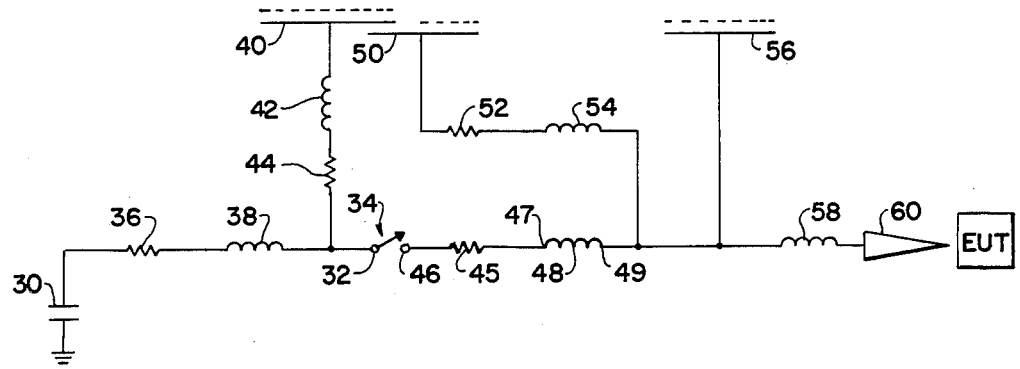
FIG. 3 is a circuit schematic, partly in block form, embodying the principles of the present invention.

The present invention can be described in detail in connection with a prior art circuit, part of which constitutes FIG. 3, such prior art circuit comprising capacitor 30, one plate of which is connected to ground. The other plate of capacitor 30 is coupled to input terminal 32 of relay switch 34 through any of a number of filter circuits exemplified by series-connected resistor 36 and inductor 38.

Figure 1:
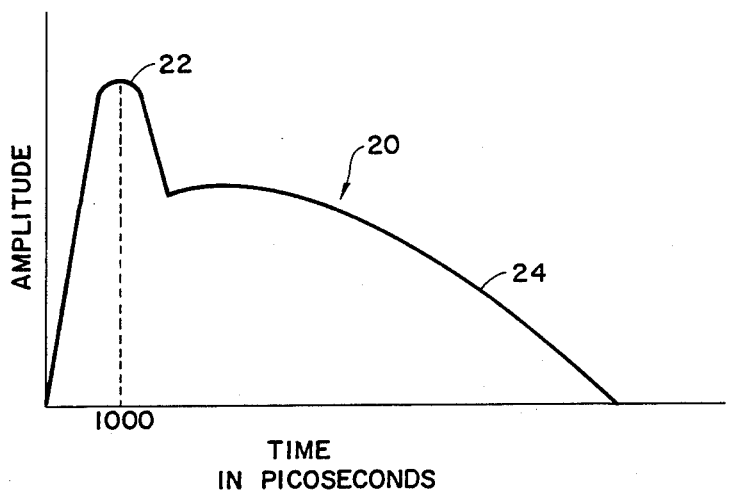
FIG. 1 is an amplitude/time graphical representation of a prior art standards waveform displaying the criteria recommended for a current impulse to be injected by an ESD simulator to equipment under test.
Figure 2:
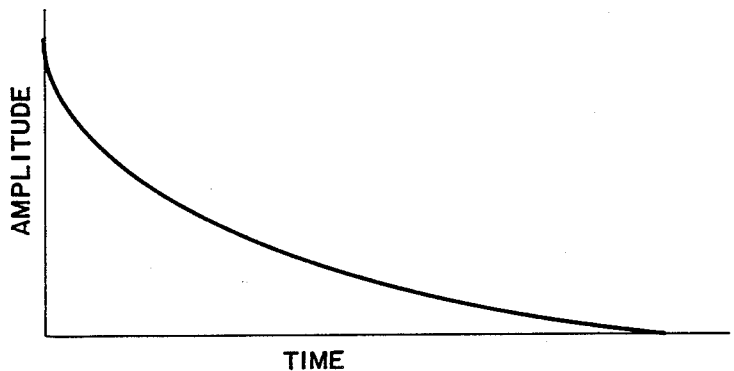
FIG. 2 is an amplitude/time graphical representation of a typical waveform developed by ESD simulation equipment having the simplified circuit suggested by earlier ESD standards.

In order to obtain the initial spike shown in FIG. 1, the prior art has purposely added capacitance, exemplified by plate 40, to the circuit. The impedance of the connection for added plate 40 will of course include stray and possibly actual circuit inductance and resistance shown schematically and respectively at 42 and 44. The connection of plate 40 to the discharge circuit is made through this low inductance and low resistance path which limits the impedance in series with one side of capacitance provided by plate 40, thereby obtaining the rapid rise and fall time required for the spike.

The added capacitance provided by plate 40 is however a "free space" capacitance, and is not provided by a normal capacitor. The free space capacitor is formed by a single plate, sphere, cylinder or other conductive object, which has capacitance relative to its surroundings, or free space. Essentially the other "plate" of a free space capacitor is the rest of the world. Consequently, that single plate 40 of the free space capacitance is shown in solid line and the other "plate" is shown in dotted line. This other "plate" of a free space capacitor is not connected by a conductive path that would inherently have inductance and resistance, but purely by capacitance. The EUT is of course part of the surroundings to which the free space capacitor is coupled in this purely capacitive manner; therefore the discharge current would tend to flow in a loop which includes the EUT. Because of the minimal impedance in the discharge loop of this capacitor it can supply current spikes with very rapid rise and fall times.

A normal capacitor formed by double or multiple plates will not suffice in place of a free space capacitor because it would have to be connected through a conductor to the EUT or to the same reference as the EUT (typically ground), in order to form a discharge loop which includes the EUT. Unless the conductive connection of such a capacitor were kept extremely short (less than 1 to 2 cm), it would have significant inductive impedance for those high frequency components associated with the initial spike of the standard ESD waveform. Because the EUT has to form a portion of the discharge path, such a limited connection length would not be practical for general ESD testing. It should also be noted that referencing capacitor plate 40 to a local logic ground is not a solution because the local ground also must be connected to the EUT reference by some conductive path.

A free space capacitor can have many physical shapes. A planar structure is preferred because it is the easiest to accommodate within a practical ESD simulator. The free space capacitor can also have many orientations with respect to the EUT. That is, it may be parallel, perpendicular, or at some angle to the EUT. A perpendicular orientation will result in the narrowest frontal cross-section for ESD simulator probe, and will thus allow better access to recessed portions of the EUT. Also, a perpendicular orientation will minimize variations in free space capacitance due to the angle of the free space capacitor's surface relative to the EUT surface. In addition, the free space capacitor must be symmetrically located relative to the contact point of the simulator and EUT, in order to reduce capacitance variations due to angle variations.

While the circuit thus described to this point will provide an output current waveform that somewhat approaches the waveform shown in FIG. 1, the initial spike would theoretically have an exponential, not a linear, rise time, and will have "wrinkles" superimposed on the theoretical waveform. It has now been found that one of the largest wrinkles is often caused by the stray capacitance of switch 34. Since switch 34 must be between free space capacitance plate 40 and the EUT, the discharge current from the stray capacitance of switch 34 (that is to say the free space capacitance of the switch) will arrive at the EUT prior to the current from free space capacitance provided by plate 40. This will result in a small current spike prior to the actual current spike. Other circuit elements in the ESD simulator are responsible for other wrinkles on the waveform. It is these anomalies in the current waveform that the instant invention reduces or eliminates.

As noted, if the inductance between output terminal 46 of switch 34 and the EUT is very low, the rise time of the spike due to the switch stray capacitance will be too fast compared to the desired waveform, the risetime of which typically includes a minimum as well as a maximum risetime specification limit. Therefore, as shown in FIG. 3, the instant invention includes inductor 48, one end 47 of which is connected to terminal 46 of switch 48 through resistor 45, typically of 50 ohms. End 49 of inductor 48 is coupled to the EUT. In addition, the instant invention preferably includes a shunt capacitance to achieve an LC filter configuration. This shunt capacitance is provided as capacitor plate 50, at least a portion of which is disposed opposite to and adjacent plate 40 so as to shunt a portion of the spike current from the switch capacitance to free space capacitance provided by plate 40. Plate 50 is conductively connected to the other end of inductor 48 through series-connected resistor 52 and inductor 54. It will be appreciated that in certain configurations, the small values of resistance and inductance of resistor 52 and inductor 54 can be provided simply by the stray resistance and stray inductance of the wiring of the circuit, as well as by actual discrete physical components. Plate 50 is also shaped to extend sufficiently beyond the perimeter of plate 40 so as to provide some free space capacitance of its own. Alternatively, plate 50 can be formed of two closely connected sections, one capacitively coupled to plate 40 and the other to free space. By controlling the values of resistor 45 and of resistor 52 and inductor 54, the amount of current shunted to capacitor plate 50 can also be controlled to achieve a more linear rise time on the initial current spike.

Importantly, in the present invention there is provided an additional but essential free space capacitor, usually of small value, in the form of capacitor plate 56 also connected to end 49 of inductor 48. Free space capacitor plate 56, in conjunction with another small inductor 58 connected between end 49 and conductive test tip 60, forms another LC filter that eliminates the remaining wrinkles from the wavefront of the ESD simulator waveform. In some cases, inductor 58 can be simply the stray inductance of the wiring between end 49 and tip 60. It will be appreciated that plate 56 provides a free space capacitance that includes the EUT as part of the other "plate" and thus serves also to compensate for the part of the free space current shunted away from the EUT by capacitor plate 50. Thus, plate 56 alternatively can be provided in two parts, one of which is intended to be capacitively coupled to the EUT and the other to free space.

Figure 4:
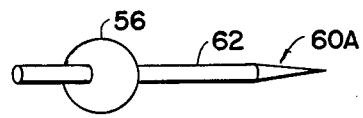
FIG. 4 are perspective views of four alternative forms A, B, C and D of test tips of the present invention.
Figure 4:
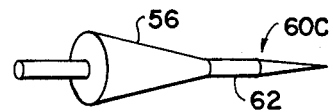
Figure 4:
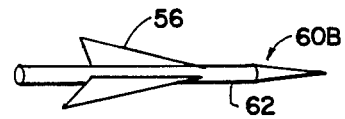
Figure 4:
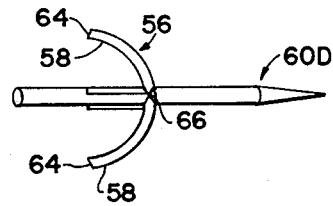
Figure 5:
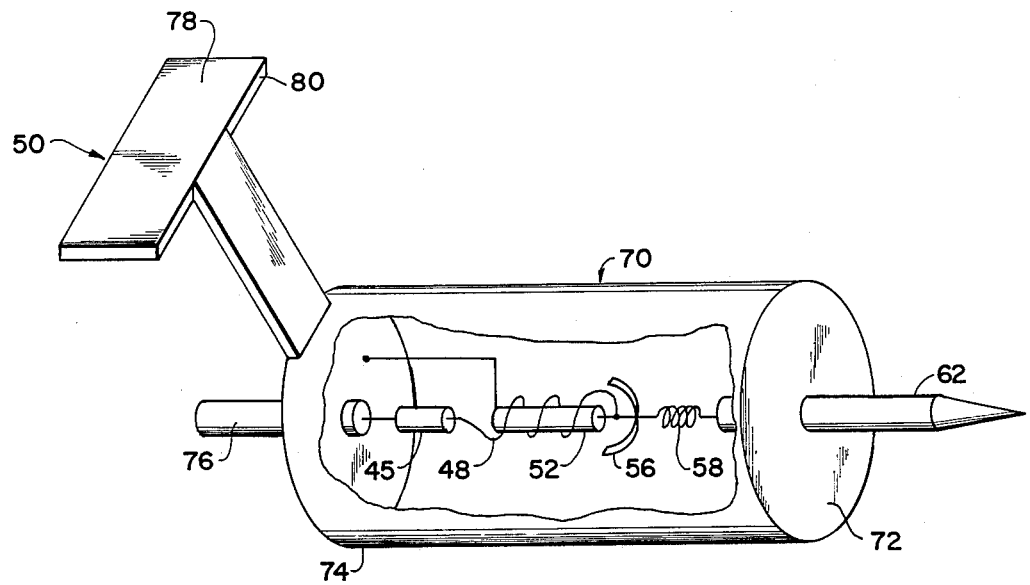
FIG. 5 is an idealized representation in side view, partly cut away and partly schematic, of a test tip for use with surge generators to provide the desired waveform of FIG. 1.

The free space capacitance provided by plate 56 is preferably symmetrical with the contact point provided by tip 60, just as capacitor plate 40 is, in order to minimize position and angle sensitivity. In addition, sensitivity of the capacitance value to the angle of capacitor plate 56 relative to the EUT, is reduced by making the shape of plate 56 recede at an angle from the point at which the simulator and EUT contact. The shape of plate 56 can be varied considerably. For example as shown in FIG. 4, test tip 60A includes an elongated, pointed conductor 62 and plate 56 is in the form of a substantially spherical element disposed about conductor 62 so that a diameter of the spherical element is colinear with the axis of elongation of conductor 62. The test tip identified in FIG. 4 as 60B includes a like conductor 62 and plate 56 is in the form of a plurality of substantially triangular vanes, the planes of each of which are colinear with the axis of elongation of conductor 62, the vanes being disposed substantially equiangularly about that axis of elongation. In the test tip shown as 60C, plate 56 is a substantially conical element disposed about conductor 62 so that the axis of symmetry of plate 56 is substantially colinear with the axis of elongation of the conductor, the apex of that cone being directed toward the pointed end of the conductor. The preferred form in which the test tip is provided is shown at 6D, plate 56 being in the form of a plurality of elongated elements 58. Each of elements 58 is substantially planar in width and arcuate in length. Elements 58 are disposed substantially equiangularly about the axis of elongation of conductor 62 so that all of ends 64 of each of the elements are each spaced a substantially same relatively large distance from the axis of elongation of the conductor, and from one another, so essentially lie in the locus of a circle centered on and spaced from the axis of elongation. All of the other ends 66 of elements 58 are spaced a relatively short distance from that axis of elongation and are electrically connected to one another. Thus, it will be seen that plate 56 in tip 6D is similar to a hemisphere that has been shredded or slotted circumferentially from a single small area, the apex of the hemisphere being centered about the axis of elongation of the conductor, such apex constituting the point of physical attachment of the plate to the tip and being electrically connected to the junction of the inductors. It will be appreciated that hemisphericity of plate 56 is not essential, but that elements 58 of the plate can assume any configuration, such as ovoidal, paraboloidal and the like, that can be disposed symmetrically about the axis of elongation of the tip.

In detail, a preferred embodiment of the test tip includes elongated hollow housing 70 of electrically insulating material. One end 72 of housing 70 is capped with metallic, elongated conductor 62 lying colinearly with the axis of elongation of housing 70. The other end 74 of housing 70 is capped with a connector 76 of any known type adapted to couple with whatever form is provided for output terminal 46 of switching means or relay 34. Inductances 48 and 58 are provided as a pair of helically wound coils mounted substantially within hollow housing 70, inductor 58 being electrically connected to conductor 62. Resistor 52 is provided as a discrete element disposed within one of the inductor coils. Capacitor plate 50 is provided as a substantially flat plate formed for example as metallic coating 78 on flat wing portion 80 of housing 70. Wing portion 80 defines a planar surface that lies in a plane spaced from and substantially parallel to the axis of elongation of housing 70 adjacent end 74 of the latter. Wing portion 80 is also elongated with its axis of elongation lying substantially normal to the axis of elongation of housing 70. Inductance 54 can be provided as a discrete coil or simply by the wiring inductance inherent in the connection between capacitor plate 50 and resistor 52. Plate 56 is shown in its hemispherical configuration as in FIG. 4D, with the point of electrical and physical attachment of the elements of plate 56 being at the junction of inductances 48 and 58.

Since certain changes may be made in the above apparatus without departing from the scope of the invention herein involved, it is intended that all material contained in the above description or shown in the accompanying drawing shall be interpreted in an illustrative and not in a limiting sense.

What is claimed is:

1. In apparatus for applying through a conductive test tip a test electrical surge to equipment under test, said apparatus including a discharge capacitor series connected through a first RL circuit to an input terminal of switching means for selectively applying a discharge from said capacitor to said test tip, said input terminal also being series connected through a second RL circuit to one electrically conductive plate of a first free space capacitance, the improvement comprising:
   a resistor, one end of which is connected to the output terminal of said switching means;
   first and second inductances series connected to one another and between the other end of said resistor and said test tip;
   a second electrically conductive plate connected to the junction of said first and second inductances so as to form part of a second free space capacitance.

2. In apparatus as defined in claim 1, the improvement including
   a capacitive shunt formed of a third plate forming part of a third free space capacitance and being so disposed as to be in physical proximity to said one plate when said tip is mounted on said apparatus;
   a third RL circuit series connected between said junction of said first and second inductances and said capacitive shunt.

3. In apparatus as defined in claim 2, the improvement including
   a metallic, elongated conductor forming part of said tip;
   means connecting said series connected first and second inductances to said conductor and being connectable to said other end of said resistor.

4. In apparatus as defined in claim 2, the improvement wherein said second plate is in the form of a substantially spherical element disposed about said tip so that a diameter of said element is colinear with the axis of elongation of said conductor.

5. In apparatus as defined in claim 2, the improvement wherein said second plate is in the form of a plurality of substantially triangular vanes, the planes of each of which are colinear with the axis of elongation of said conductor, said vanes being disposed substantially equiangularly about said axis of elongation.

6. In apparatus as defined in claim 2, the improvement wherein one end of said conductor is pointed and said second plate is in the form of a substantially conical element disposed about said conductor so that the axis of symmetry of said element is substantially colinear with the axis of elongation of said conductor, and the apex of said cone is directed toward said pointed end of said conductor.

7. In apparatus as defined in claim 2, the improvement wherein one end of said conductor is pointed and said second plate is in the form of a plurality of elongated elements attached to said tip, each of said elements being substantially planar in width and arcuate in length, said elements being disposed substantially equiangularly about the axis of elongation of said conductor so that all of one ends of each of said elements are each spaced a substantially same relatively large distance from said axis of elongation and from one another, and all of the other ends of said elements are spaced a relatively short distance from said axis of elongation and are electrically connected to one another.

8. In apparatus as defined in claim 2, the improvement wherein said plurality of elements lie in the locus of a hemisphere on the apex of which is the point of attachment of said elements to said tip.

9. In apparatus as defined in claim 2, the improvement wherein said third plate is formed of a first portion capacitively coupled to said one plate, and a second portion capacitively coupled to free space.

10. In apparatus as defined in claim 2, the improvement wherein said second plate is formed of a first portion capacitively couplable to said equipment under test when said tip is brought toward contact with the latter, and a second portion capacitively coupled to free space.

11. In apparatus as defined in claim 2, the improvement including an elongated hollow housing of electrically insulating material, said housing having one end thereof capped with said metallic, elongated conductor and the other end thereof capped with a connector adapted to couple with said output terminal of said switching means;

said first and second inductances being a pair of helically wound coils mounted substantially within said hollow housing; and said third RL circuit includes a resistor disposed within the interior of one of said coils.

* * * * *